US008426871B2

(12) United States Patent
Rapoport et al.

(10) Patent No.: US 8,426,871 B2
(45) Date of Patent: Apr. 23, 2013

(54) PHOSPHOR CONVERTING IR LEDS

(75) Inventors: William Ross Rapoport, Bridgewater, NJ (US); James Kane, Lawrenceville, NJ (US); Kirin T. Castelino, Mahwah, NJ (US)

(73) Assignee: Honeywell International Inc., Morristown, NJ (US)

( * ) Notice: Subject to any disclaimer, the term of this patent is extended or adjusted under 35 U.S.C. 154(b) by 421 days.

(21) Appl. No.: 12/791,021

(22) Filed: Jun. 1, 2010

(65) Prior Publication Data
US 2010/0320480 A1 Dec. 23, 2010

Related U.S. Application Data

(60) Provisional application No. 61/218,531, filed on Jun. 19, 2009.

(51) Int. Cl.
*H01L 27/15* (2006.01)
*H01L 33/00* (2010.01)

(52) U.S. Cl.
USPC ............................ 257/79; 257/98; 315/112

(58) Field of Classification Search .................. 257/79, 257/98; 315/112
See application file for complete search history.

(56) References Cited

U.S. PATENT DOCUMENTS

| 3,757,174 A | 9/1973 | Shigemasa et al. |
|---|---|---|
| 4,008,485 A | 2/1977 | Miyoshi et al. |
| 4,575,742 A | 3/1986 | Kohashi et al. |
| 5,813,753 A | 9/1998 | Vriens et al. |
| 5,831,268 A | 11/1998 | Morita et al. |
| 5,865,529 A | 2/1999 | Yan |
| 5,962,971 A | 10/1999 | Chen |
| 5,998,925 A | 12/1999 | Shimizu et al. |
| 6,252,254 B1 | 6/2001 | Soules et al. |
| 6,366,018 B1 | 4/2002 | Garbuzov et al. |
| 6,494,597 B1 | 12/2002 | Yu |
| 6,495,860 B1 | 12/2002 | Yu |
| 6,513,949 B1 | 2/2003 | Marshall et al. |
| 6,682,331 B1* | 1/2004 | Peh et al. ................ 425/112 |
| 7,286,296 B2 | 10/2007 | Chaves et al. |
| 7,370,994 B2 | 5/2008 | Li |
| 8,297,061 B2* | 10/2012 | Brandes ..................... 62/3.1 |
| 2005/0029927 A1* | 2/2005 | Setlur et al. ............. 313/501 |
| 2006/0038198 A1 | 2/2006 | Chua et al. |
| 2008/0099728 A1 | 5/2008 | Jin et al. |
| 2009/0034201 A1* | 2/2009 | Brandes ................... 361/704 |
| 2009/0078859 A1* | 3/2009 | Wong et al. .............. 250/226 |
| 2010/0207132 A1* | 8/2010 | Lee et al. .................. 257/89 |
| 2010/0207139 A1 | 8/2010 | Winkler et al. |

FOREIGN PATENT DOCUMENTS

| JP | 2001352101 A | 12/2001 |
|---|---|---|
| JP | 2006152958 A | 6/2006 |
| JP | 2008124168 A | 5/2008 |
| KR | 1020070053293 A | 5/2007 |
| KR | 1020080037707 A | 4/2008 |

* cited by examiner

Primary Examiner — Long Tran
(74) Attorney, Agent, or Firm — Ingrassia Fisher & Lorenz, PC

(57) ABSTRACT

The production of light of various wavelengths using IR phosphor down conversion techniques using existing LED emissions to pump sensitizer-rare earth ions that emit at other wavelengths. A sensitizer absorbs an LED chip pump emission and then transfers that energy with high quantum efficiency to dopant ions that then emits at their characteristic wavelength.

13 Claims, 6 Drawing Sheets

PHOSPHOR CONVERTING IR LEDS

RELATED APPLICATIONS

This application claims the benefit of U.S. Provisional Application Ser. No. 61/218,531, filed on Jun. 19, 2009, currently pending, which is hereby incorporated by reference in its entirety.

FIELD OF THE INVENTION

The present technology relates to light emitting devices. More particularly, the present technology pertains to light emitting semiconductor structures coated with one or more infrared light emitting phosphors.

DESCRIPTION OF THE RELATED ART

Light emitting diodes (LEDs) are p-n junction devices that convert an incoming flow of electric energy into an outgoing flow of electromagnetic radiation. LEDs emit electromagnetic radiation in ultraviolet, visible or infrared regions of the electromagnetic spectrum, where the emission wavelength typically depends on the diode semiconductor chip materials from which they are produced. For example, LEDs formed from aluminum gallium arsenide containing semiconductor chip materials are known to emit red visible light, LEDs formed from aluminum gallium phosphide containing semiconductor chip materials are known to emit green visible light and LEDs formed from indium gallium nitride containing semiconductor chip materials are known to emit a blue-green light when excited by electrical energy.

In addition to the radiation emission wavelength, many LEDs also vary in brightness. In many applications, such as for illuminating billboard displays or stage lighting applications, visible light emitting diodes of high brightness are desired, while LEDs of lower brightness may be sufficient for status indicator lights on appliances. High brightness is also desirable for applications such as flashlights and lanterns which employ "white light" LEDs, i.e. LEDs that emit light having a wavelength that the human eye interprets as white light. White light LEDs are typically produced by coupling an LED of one color with a phosphor coating of a different color to produce white light. Most commonly, a blue LED, such as an LED made from an indium gallium nitride semiconductor, coated with a yellow emitting phosphor, such as cerium-doped yttrium aluminum garnet, will together produce light having a CIE chart representative of white light emission. See, for example, U.S. Pat. No. 5,998,925 which teaches this common formation of a white phosphor-based LED. Such "phosphor-based LED" technology allows for the manufacture of LEDs with precise dynamic color control having varying degrees of quality and brightness.

Light emitting diodes are also known that are capable of emitting non-visible radiation, such as infrared (IR) radiation. Infrared light emitting diodes are employed for various applications from television remote controls to night vision devices such as short wave infrared (SWIR) cameras and are often employed in the telecommunications industry. Typical commercially available IR LEDs are available at a few discreet wavelength values up to 1.55 microns and have been conventionally produced by using an epitaxial wafer comprising P- and N-type gallium arsenide (GaAs) epitaxial layers, typically a GaAs epitaxial wafer doped with an amphoteric impurity such as silicon. See, for example, U.S. Pat. No. 3,757,174 owned by Sharp Corporation; see also U.S. Pat. No. 4,008,485, owned by Hitachi, Ltd., which teaches GaAs based LEDs doped with tin, selenium, tellurium or sulfur. U.S. Pat. No. 4,575,742 owned by Mitsubishi Monsanto Chemical Co. also teaches improved infrared LEDs of this type that also incorporate a mixed crystal layer on an infrared light emitting diode substrate to improve the efficiency of such conventional IR LEDs. U.S. Pat. No. 5,831,268 teaches an apparatus which utilizes an infrared LED to detect the presence of a reflective liquid.

Compared to visible light emitting LEDs, such conventional infrared light emitting LEDs generate infrared light that is significantly less intense, only emitting about 1 milliwatt per LED semiconductor chip due to an inability to create an effective band gap structure. Accordingly, there is a need in the art for stronger IR emitting LEDs at various wavelengths. The present technology provides a solution to this need in the art. In addition, it has also been found that light of other wavelengths can be produced using IR phosphor down conversion techniques using existing LED primary light emissions as a pump for exciting a dopant (e.g. rare earth ions) that emit at other secondary light wavelengths.

SUMMARY OF THE INVENTION

Light emitting semiconductor structures coated with one or more infrared light emitting phosphors are disclosed herein.

In one aspect, a stokes radiation emitting device is provided that includes a) a light source, and b) an energy downconverting phosphor material on the light source. The phosphor material can include at least one infrared radiation emitting phosphor that absorbs light energy emitted from said light source and emits infrared radiation responsive to said absorbed light energy.

In another aspect, a stokes radiation emitting light emitting diode assembly is provided that includes: a) a mount lead comprising a recessed cup and a lead, b) a light emitting diode semiconductor chip mounted in the recessed cup of the mount lead, and c) a phosphor material on the light emitting diode semiconductor chip. The recessed cup optionally include a reflective metal capable of reflecting ultraviolet to infrared radiation. The light emitting diode semiconductor chip can have an electrode that is electrically connected to the mount lead, and the light emitting diode semiconductor chip can include a material that emits light having wavelengths ranging from the ultra-violet to the near infrared regions of the electromagnetic spectrum when excited by electrical energy. The phosphor material can include at least one infrared radiation emitting phosphor that absorbs light energy from said light emitting diode semiconductor chip and emits infrared radiation responsive to said absorbed light energy.

DETAILED DESCRIPTION

Infrared light emitting LEDs of the present technology generate light that is much stronger than conventional infrared light emitting LEDs, on par with the intensity and brightness capabilities of visible light. The LEDs disclosed herein employ an infrared radiation emitting phosphor material on a light source. The phosphor material absorbs radiation generated by the light source and thereafter emits downconverted, stokes radiation responsive to the absorbed light. As used herein, "stokes radiation" is defined as radiation (i.e. photons) having lower energy (a longer wavelength) than the radiation from which they are excited or generated, which means that an energy downconversion takes place. Accordingly, a "stokes radiation emitting device" is defined as a device manufactured to emit stokes radiation.

Figure 1:
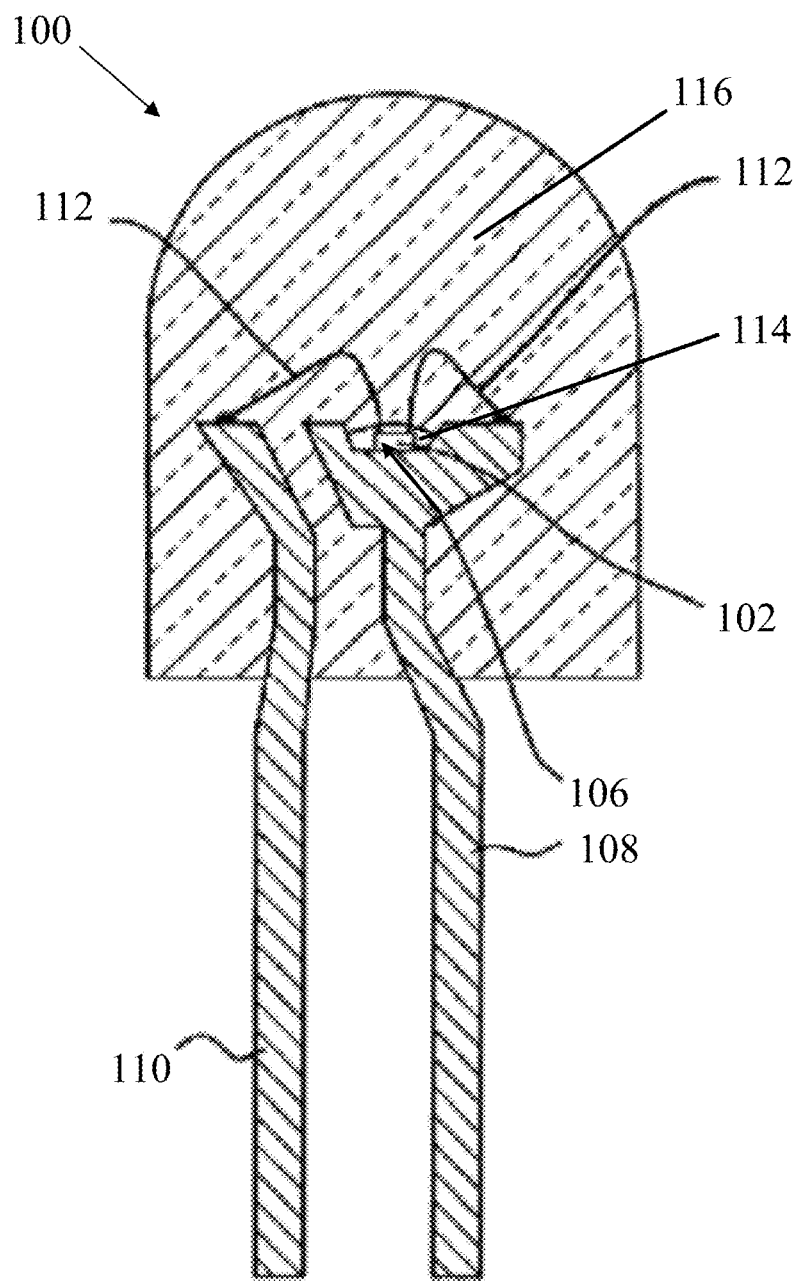
FIG. 1 is a schematic section view of one embodiment of a light emitting diode assembly.
Figure 2:
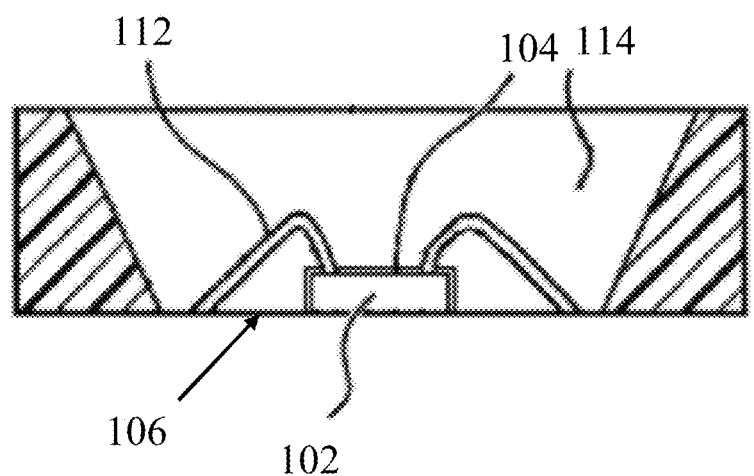
FIG. 2 is a schematic section view illustrating one embodiment of a light emitting diode semiconductor chip in a recessed cup having a phosphor material coated directly on the semiconductor chip.

Referring to FIGS. 1 and 2, a stokes radiation emitting LED assembly 100 can include a light source 102 and an energy downconverting phosphor material 104 on the light source 102. Light source 102 emits light as light energy having one or more wavelengths ranging from the ultra-violet to the near infrared regions of the electromagnetic spectrum. The light energy emitted by the light source 102 is also referred to herein as primary light, primary light energy or primary radiation. As used herein, a "phosphor" is defined as a material that emits secondary light as light energy when excited by primary light of a certain wavelength, where the primary light energy originates from said light source 102. The light energy emitted by the phosphor 104 is also referred to herein as secondary light, secondary light energy or secondary radiation. Phosphor material 104 can include at least one infrared radiation emitting phosphor that absorbs light energy from said light source 102 and emits infrared radiation responsive to said absorbed light energy. To generate infrared stokes radiation, the light source 102 generates and emits light (radiation) having a shorter wavelength and greater energy than infrared radiation. Accordingly, light source 102 can emit light at one or more wavelengths ranging from the ultra-violet region of the electromagnetic spectrum to the near-infrared region of the electromagnetic spectrum, which encompasses visible light. More preferably, the light source 102 can emit light at one or more wavelengths ranging from a wavelength of from about 350 nm to about 980 nm. Most preferably said light source 102 can include one or more light emitting diodes that emit light at a wavelength of from about 350 nm to about 980 nm.

Figure 3:
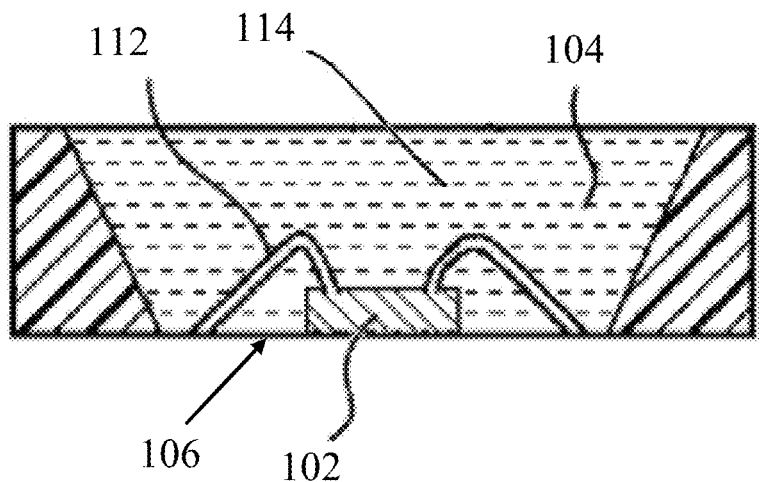
FIG. 3 is a schematic section view illustrating one embodiment of a light emitting diode semiconductor chip in a recessed cup, where a phosphor material is present in admixture with an infrared radiation-transparent material that fills the cup and covers the semiconductor chip.

As shown in FIGS. 1-3, light source 102 can comprises an LED semiconductor chip, also known in the art as an LED die, and preferably can include one or more ultraviolet light emitting LEDs to near infrared light emitting LEDs. Suitable LED dies/chips are commercially available, such as from Clairex Technologies, Inc. of Plano, Tex. When coated with a phosphor, such an LED light source is also referred to in the art as a "pump" or "pump LED," where the LED emits "pump light." When a plurality of light emitting diodes are present, they all can be identical, or they can be constructed of varying LED semiconductor chip materials.

Suitable LED semiconductor chip materials non-exclusively include any materials that emit radiation in the ultraviolet to the near infrared regions of the electromagnetic spectrum when excited or activated by electrical energy. Preferably, said light source/light emitting diode semiconductor chip 102 can include one or more light emitting diodes that comprise a semiconductor formed from gallium arsenide, aluminum gallium arsenide, gallium nitride, indium gallium arsenide, indium gallium nitride, aluminum gallium nitride, aluminum gallium phosphide, gallium arsenide phosphide, gallium phosphide, aluminum gallium indium nitride, or two or more thereof, including combinations thereof. Most preferably, the light source/LED semiconductor chip 102 can include one or more light emitting diodes that comprise a semiconductor formed from indium gallium arsenide (InGaAs). As is well known in the art, an LED chip is commonly epitaxially formed on a base substrate (not shown in the Figures), non-exclusive examples of which are substrates formed from materials such as sapphire, silicon or silicon carbide.

In general, an LED semiconductor chip 102 coated with a phosphor 104 can be mounted in any conventional light emitting diode assembly without limitation. FIG. 1 illustrates an exemplary light emitting diode assembly useful herein. As illustrated in FIG. 1, a stokes radiation emitting light emitting diode assembly 100 can include an inner lead 110 and a mount lead 108, the mount lead 108 preferably comprising a recessed cup 106. The light source/LED semiconductor chip 102 can be mounted in the recessed cup 106 of the mount lead 108. This type of a recessed housing structure, also referred to in the art as a dimpled cup or dimpled cone and as disclosed in U.S. Pat. No. 5,865,529, is commonly known in the art. While such a dimpled structure is not mandatory, but can be effective in reducing the angular divergence of the infrared radiation emitted from the phosphor material 104, and can also serve as an effective heat sink when fabricated from metal or another suitable heat sink material. As further illustrated in FIG. 1, at least one electrode 112 is electrically connected to both leads 108 and 110 and the light source/LED semiconductor chip 102, bonding the leads 108 and 110 to the light source/chip 102. As is commonly known in the art, said electrodes can be formed of gold wire, also referred to as gold bond wires. Such an LED assembly can also include circuitry (not shown) connected to the LED, a power supply coupled to the circuitry and the LED via cables to supply current to the circuitry, and a power regulator coupled to the power supply to produce a continuous supply of DC voltage. The power regulator can be coupled to the input of a power resistor, and the output of the power resistor can be coupled to the LED, all of which is conventional in the art. This type of structure, where the phosphor 104 coated LED 102 is mounted in the recessed housing structure 106, may also be referred to in the art as an "LED package."

As stated previously, the LED semiconductor chip can be coated with phosphor material 104 that absorbs light emitted by the chip and emits infrared radiation responsive to said absorbed light, where phosphor material 104 comprises one or more substances known in the art as "phosphors." Preferably, the phosphor material 104 emits infrared radiation at a wavelength of about 800 nm or greater. Most preferably, the phosphor material can include a particulate substance or combination of particulate substances that emits infrared radiation at a wavelength of about 800 nm or greater. The phosphor 104 can alternately comprise a crystalline structure known in the art as a host lattice, which host lattice can be combined with a light emitting dopant. Such host lattices structures and host lattice-dopant combinations are commonly known in the art and are described in more detail below. A "dopant" as used herein is a substance that absorbs primary light energy originating from the light source and emits secondary light of a secondary wavelength in response to said primary light energy. When used in combination with a host lattice, the dopant typically is an elemental substitute in the host lattice crystal, serving as a substitute for another element. The element being replaced depends on the composition of the host lattice. The dopant element is generally of the same charge and also generally at a small level compared to the element that it is replacing. For example, in a host lattice-dopant combination consisting of Nd:Cr:YGG, neodymium (Nd) and chromium (Cr) are the dopants and YGG is the host lattice material, and Nd and Cr are substituted in for yttrium in the host lattice material.

The substances comprising the phosphor material can include one or more sensitizers, one or more dopants, or both one or more sensitizers and one or more dopants. As used herein, a "sensitizer" comprises an element that will function as a dopant for supplying dopant ions, where the sensitizer substance is both capable of absorbing light energy from a light source and is also capable of non-radiatively transferring said light energy to a light emitting dopant. In a host lattice, a sensitizer can be incorporated into the phosphor host lattice as a dopant ion. Useful sensitizers non-exclusively include chromium (Cr) and iron (Fe), as well as other materials such as cerium, thulium and erbium. Of these, cerium, thulium and erbium are most useful as sensitizers when associated with other emitting ions such as samarium, holmium, and thulium. The sensitizer can also be capable of emitting light, in which case a separate dopant is optional. An example of this type of sensitizer is chromium. Accordingly, the dopant will absorb light energy from the light source, sensitizer or both the light source and the sensitizer, and then emit radiation responsive to said absorbed light energy. The use of a sensitizer is not mandatory. However, the LED light emission is generally much broader spectrally than the absorption bands of the phosphor without a sensitizer. Phosphors typically have narrow absorption bands and thus a portion of the source LED light might get through the phosphor, i.e. the phosphor can fail to absorb part of the LED emission, or absorption of the LED emission by the phosphor can be partially reduced, although the LED emission generally is still highly scattered by the phosphor particles. When at least part of the LED emission light is not being absorbed, it does not contribute to the energy transfer, and the efficiency is reduced. One means for reducing this energy loss is to add more phosphor to increase the amount of absorption. However, this may increase scatter losses and other negative effects, making the overall efficiency lower. Alternately, a sensitizer can be used to avoid this issue. The sensitizer is essentially a second dopant that will absorb the LED energy, but will non-radiatively transfer the energy to the emission dopant of the phosphor, such as a rare earth element. In many cases, such a non-radiative transfer has very high quantum efficiency, resulting in improved performance of the LED. Higher quantum efficiency leads to greater stokes radiation conversion efficiency and a reduction in energy loss. If it is desired to maximize the output and efficiency of the stokes radiation emitting devices, one skilled in the art can determine an optimum amount of phosphor, sensitizer dopant level, particle size, active ion dopant level and particular LED that is exciting the material, for any particular application.

In some preferred examples, the phosphor is present as a combination or mixture of a host lattice and a dopant. A host lattice can be any of the crystalline structures that are well known in the art. Optimization of the host lattice-dopant mixture can provide maximum conversion efficiency for IR LED packages. Suitable host materials non-exclusively include one or more garnets, one or more iron-garnets, one or more oxysulfides, one or more fluorides and colquiriite, each of which exhibits a crystalline structure. Examples of preferred host lattice materials include yttrium gallium garnet (YGG) and yttrium aluminum garnet (YAG). These are basic crystal structures having chemical compositions of $Y_3Ga_5O_{12}$ (YGG) and $Y_3Al_5O_{12}$ (YAG), respectively.

In a host lattice-dopant combination, the phosphor generally substitutes another element for one in the host lattice in a small percentage that has optical emission properties. A phosphor serving this purpose can comprise a single dopant or can comprise multiple dopants, and one of the dopants might act as a sensitizer. When present, a sensitizer ion is the primary absorber for the phosphor, but is not the main emitter. The energy that the sensitizer absorbs is transferred to the main active emitter ion (main dopant) through non-radiate transfer. The emitting ion is excited through that transfer into an excited state that is capable of emitting light as its energy cascades down to the ground state. Repeating the example from above, in a host lattice-dopant combination consisting of Nd:Cr:YGG, Nd is considered the activator ion (optically active and the primary emitting dopant), Cr is the sensitizer (primary absorber and energy transfer agent) and YGG is the host lattice material. The two dopants, Nd and Cr, are substituted in for yttrium in the host lattice material. Typically, Nd is incorporated at a relatively low concentration, generally at about 1% by weight, and Cr is typically incorporated at a higher concentration, generally at about 2% to about 20% by weight of the combined host lattice-dopant material.

The concentrations of the dopant(s) will vary widely depending on the composition of the host lattice material and the particular dopant ions utilized. This is generally because many activators (i.e. the primary emitting dopant) exhibit non-linear behavior, such as concentration quenching, and the ions often interact with each other, resulting in potential problems such as reduced quantum efficiency and reduced decay lifetimes. Further, while the addition of more absorber (i.e. sensitizer) increases the absorption capability of the material, it can result in the same problems. In addition, all elements are of different sizes due to the number of protons, neutrons and electrons, so the "fit" into the lattice will be a bit different for each element that is used. Changing the various sizes by elemental substitution has various effects such as slightly moving the activator ion emission wavelength or the absorption wavelength since the resonance conditions are changed. Thus, it is necessary to balance such advantages and disadvantages as desired for a particular application.

Preferred phosphor materials non-exclusively include one or more rare earth element doped garnets, one or more rare earth element doped iron garnets, one or more rare earth element doped oxysulfides, one or more rare earth element doped fluorides, one or more rare earth element doped colquiriites, other rare earth doped garnets including mixed garnets, and more than one thereof, including combinations and mixtures thereof, wherein each of said phosphors can be doped with or include one or more rare earth elements. More particularly, preferred phosphor materials non-exclusively include at least one garnet host phosphors doped with one or more rare earth elements that act as photon emitting ions, at least one garnet host phosphor doped with chromium as a sensitizer or as an emitter and optionally one or more photon emitting rare earth elements, at least one garnet host phosphor doped with iron as a sensitizer or as an emitter and optionally one or more photon emitting rare earth elements, yttrium gallium garnet, yttrium aluminum garnet, or more than one thereof, including combinations and mixtures thereof. The active rare earth elements include cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm) and ytterbium (Yb). Of these, preferred phosphors include a garnet host and are based on dopants comprising rare earth elements neodymium, holmium, erbium and/or ytterbium. Three preferred IR LEDs are exemplified in Examples 1-3 below and their emission spectrums are graphically illustrated in FIGS. 5-7.

In said mixtures including a host and a lattice dopant, different levels of dopant are employed depending on the host lattice material and the sensitizer composition. There is no set formula to make this determination, but said mixtures will typically have a dopant content of from about 0.1% to about 50% by weight of the mixture. The dopant concentration range will generally depend on the type of dopant and/or sensitizer employed, and this range is not intended to be limiting. For example, in a host-lattice mixture, a chromium sensitizer will typically comprise from about 1% to about 30% by weight of a host-lattice mixture; a neodymium dopant will typically comprise from about 0.1% to about 2% by weight of a host-lattice mixture; an erbium dopant will typically comprise from about 0.1% to about 50% by weight of a host-lattice mixture; a thulium dopant will typically comprise from about 0.1% to about 8% by weight of a host-lattice mixture; a holmium dopant will typically comprise from about 0.1% to about 10% by weight of a host-lattice mixture; an ytterbium dopant will typically comprise from about 0.1% to about 30% by weight of a host-lattice mixture; and a praseodymium dopant will typically comprise from about 0.1% to about 10% by weight of a host-lattice mixture. When both a sensitizer and a separate emitting dopant (main dopant) are present, the ratio of sensitizer:emitting dopant can also vary widely. When the sensitizer is present, it is typically present in a greater concentration than the emitting dopant. In a host lattice-dopant combination where the dopant comprises both a sensitizer and an emitting dopant, the sensitizer is typically present in an amount of from about 1% to about 25% by weight of the host lattice-dopant combination, and the emitting dopant (emitting dopant ion(s)) is typically present in an amount of from about 0.1% to about 10% by weight of the host lattice-dopant combination. However, these proportions may vary widely depending on the particular host lattice material employed and these ranges are not intended to be limiting.

In some examples, the phosphor material most preferably comprises a garnet host with a chromium or iron sensitizer that absorbs the LED emission, and further comprises one or more rare earth element dopants. The spectral location of the LED most preferably coincides with the wide absorption of the sensitizer. The sensitizer will non-radiatively transfer the energy to rare earth ions from the rare earth element dopant, which then emits light energy at its characteristic wavelength. Most rare earth ions exhibit very narrow spectral absorption lines compared to the spectral width of available LEDs. The use of a spectrally very broad absorber sensitizer may then capture more of the LED emission and efficiently transfer it to the emitting ion with greater efficiency than the ion can do by itself with the same LED emission.

The phosphor material 104 is preferably supplied in powder form as a fine powder where the powder particles are preferably held together with a binder material. The phosphor particles preferably have a micron-scale diameter, with preferred particle diameters ranging from about have particle sizes in the range of about 0.1 μm to about 50 μm, more preferably from about 0.1 μm to about 10 μm, and most preferably from about 0.1 μm to about 5 μm. A sufficient amount of phosphor needs to be placed on the LED chip for effective absorption (>90%) of the LED emission. The phosphor then converts the emission at the LED wavelength, i.e. the primary light, to the characteristic wavelengths of the rare earth ion, i.e. secondary light.

Phosphor material 104 is typically combined with a binder prior to application onto the light source/LED semiconductor chip 102. As shown in FIG. 2, phosphor material 104 can be applied directly onto the light source/LED semiconductor chip 102 as a layer or surface coating, where phosphor material 104 is preferably blended with a binder prior to application onto the light source/LED semiconductor chip 102. Suitable binders non-exclusively include silicone, acrylic, epoxy, polyimide, and other thermoplastic materials that would be determined by one skilled in the art. Typically, one or more phosphor powders or a mixture of phosphor powders are mixed with an uncured binder to form an uncured slurry, which slurry is then deposited onto the light source/LED semiconductor chip 102 and subsequently cured. Techniques for applying the phosphor are conventional in the art and include, for example, conventional spraying, conventional sputtering and the like, chemical methods such as sol-gel technology, as well as more sophisticated methods, such as radio frequency (RF) sputtering. Curing techniques are also well known. In a preferred embodiment, the binder comprises room temperature vulcanizing (RTV) silicone.

Only a small amount of phosphor is needed to achieve emission of the rare earth ion. The required thickness of the phosphor layer on the light source/LED semiconductor chip 102 is dependent upon the doping levels in the phosphor because that determines the absorption levels of the phosphors. In general, the phosphor layer on the light source/LED semiconductor chip 102 has a preferred thickness of from about 50 μm to about 150 μm, more preferably from about 50 μm to about 100 μm, and most preferably from about 75 μm to about 100 μm. In addition, the coating is preferably substantially uniform on all surfaces of the light source/LED semiconductor chip 102. In an alternate embodiment, illustrated in FIG. 3 and discussed in more detail below, the phosphor particles can be blended with an IR-transparent coating material 114. IR-transparent coating material 114 can be employed in addition to the aforementioned binder, or can itself serve as a binder. When the phosphor 104 and IR-transparent coating material 114 are blended to form a blend, the blend is used to encapsulate the light source/LED semiconductor chip 102 in the recessed cup 102. Alternately, the light source/LED semiconductor chip 102 can first be coated with a phosphor material 104 followed by encapsulation of the coated light source with material 114.

As illustrated in FIGS. 2 and 3, filling the recessed cup 106 of the mount lead 108 and substantially completely covering the LED semiconductor chip is the aforementioned infrared radiation-transparent coating material 114 that encapsulates the LED semiconductor chip 102. The IR-transparent coating material 114 can also substantially completely cover or partially cover each electrode 112, as is conventional in the art. As used herein, "substantially completely covering" means that the IR-transparent coating material 114 covers the entire chip 102 to protect the chip from mechanical damage, moisture, and atmospheric exposure, and can also serve to increase light extraction efficiency from the chip relative to a chip that is exposed to air. Suitable IR-transparent coating materials are well known in the art and include materials such as epoxy resin, silicon and glass. Generally any IR-transparent polymer that can be deposited without tearing away the gold bond connections (electrodes 112) can be used.

As mentioned previously and as illustrated in FIG. 2, the IR-transparent coating material 114 can be applied on top of a layer of phosphor material 104 on the light source/LED semiconductor chip 102. Alternately, as mentioned previously and as illustrated in FIG. 3, the IR-transparent coating material 114 can optionally serve as a binder for the phosphor material 104, wherein the IR-transparent coating material 114 is pre-blended with a phosphor material 104 and subsequently applied on top of the light source/LED semiconductor chip 102. In each embodiment, the phosphor particles are generally randomly oriented and interspersed throughout a cured binding material. In the embodiment illustrated in FIG. 3, the phosphor 104 is interspersed throughout the IR-transparent coating material, and is preferably homogenously blended therein. In yet another embodiment, the recessed cup can be partially filled with an IR-transparent coating material 114 containing no phosphor material, and also partially filled with an aforementioned phosphor 104/IR-transpartent coating 114 blend. In some examples, the phosphor material 104 is blended with a binder and deposited as a direct coating/layer on the light source/LED chip 102 as illustrated in FIG. 2.

The binder in a phosphor-binder mixture can preferably be used sparingly, thus utilizing only enough to hold the material together and have it properly mixed. For example, if present, the binder can comprise at least about 0.1% by weight of the phosphor-binder mixture, or can comprise less than about 10% by weight of the phosphor-binder mixture.

As mentioned previously, in a light emitting diode assembly, the phosphor-coated light emitting diode die is preferably mounted in a recessed housing structure that assists in reducing the angular divergence of generated stokes radiation. To achieve said angular reduction, the geometry of recessed cup 106 should have a shape that maximizes the extraction of light from the diode in the recess (or dimple). Particularly, as illustrated in the figures, recessed cup 106 preferably has a frustoconical shape, defined by a conical shape having inward sloping sidewalls and a flat, round or rectangular floor. Most preferably, the sidewalls are oriented at angles of from about 45 degrees to about 60 degrees with respect to the floor, but such may vary. This type of recessed housing structure is commonly known in the art and is also referred to in the art as a dimpled cup or dimpled cone. As an alternative, recessed cup 106 can have curved sidewalls, such as disclosed in U.S. Pat. Nos. 6,494,597 and 6,495,860, the disclosures of which are incorporated herein by reference. Techniques for the formation of recessed cup 106 are conventionally known, and said recessed cup 106 is preferably fabricated from metal or another suitable heat sink material allowing for efficient removal of heat generated by said light source/LED semiconductor chip 102 and/or said phosphor material 104. Additionally, to further improve light emission efficiency, recessed cup 106 preferably is fabricated from a reflective metal capable of reflecting the LED emission and phosphor emission wavelengths (capable of reflecting ultraviolet to infrared radiation), or is alternately coated or plated with such a reflective material, such as silver, gold, rhodium or other high efficiency metallic reflection material, to provide recessed cup 106 with a reflective surface.

Figure 4:
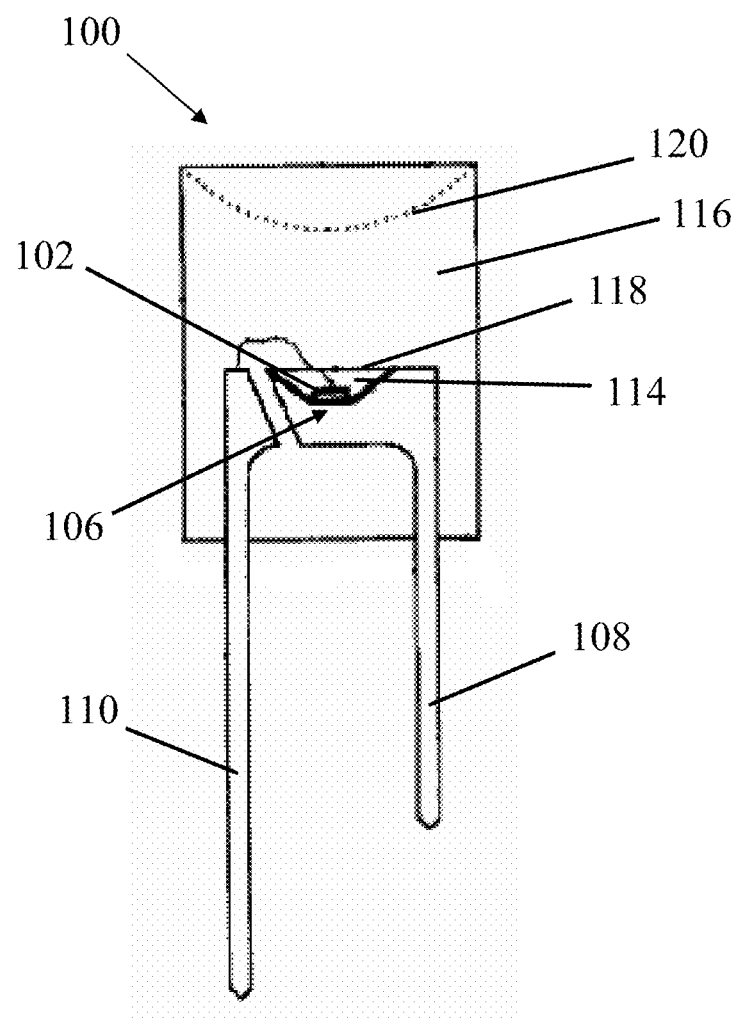
FIG. 4 is a schematic section view illustrating one embodiment of a light emitting diode assembly according to the present technology that includes both an optical filter and a collimating lens.

As seen in FIG. 4, in the event that a portion of the primary light emitted by the light source/LED semiconductor chip 102 passes through the IR-transparent coating material 114 without contacting the phosphor particles, the stokes radiation emitting diode assembly preferably incorporates an optical filter 118 positioned adjacent to both the light source/LED semiconductor chip 102 and the phosphor material 104. Optical filter 118 is transparent to infrared radiation but capable of blocking the transmission of light emitted from the light source/LED semiconductor chip 102. Such optical filters 118 are well known in the art. As further illustrated in FIG. 4, the stokes radiation emitting light emitting diode assembly also preferably incorporates a light collimating lens 120 positioned adjacent to the light source/LED semiconductor chip 102 that is capable of further reducing the angular divergence of the infrared radiation emitted from said phosphor material 104. Collimating lenses are also well known in the art. The collimating lens 120 can be a concave conical shaped lens, as described in U.S. Pat. No. 5,865,529. Another useful example can be found in U.S. Pat. No. 7,370,994, which teaches collimating lenses for LED lamps.

In one example, the stokes radiation emitting diode assembly can comprise both an optical filter 118 positioned adjacent both the light source/LED semiconductor chip 102 and a collimating lens 120 positioned adjacent to the light source/LED semiconductor chip 102 that is capable of reducing the angular divergence of the infrared radiation emitted from said phosphor material. An example of a useful construction including both an optical filter and a collimating lens is disclosed in U.S. Pat. No. 7,286,296, the disclosure of which is incorporated herein by reference.

As illustrated in FIGS. 1 and 4, the LED semiconductor chip 102, electrodes 112, and top of leads 108 and 110 are preferably encapsulated by an encapsulating material 116, such as epoxy, silicone or generally any other polymer that is transparent to the infrared radiation emission wavelength. Encapsulating material 116 also preferably encapsulates the optional optical filter 118 and optional collimating lens 120 when present. Encapsulating material 116 can comprise the same material as, and optionally be equivalent to, the infrared radiation-transparent coating material 114 that encapsulates the LED semiconductor chip 102, or can be independent and different than material 114. Preferably, the materials 114 and 116 are one and the same. Using conventional molding techniques, encapsulating material 116 can be fabricated into a variety of shapes, allowing for customized control of the direction of radiation emission from the phosphor material 104. For example, the encapsulating material 116 can be fabricated into a hemispherical shape, as seen in FIG. 1, allowing for emission of light at a large light emission angle. Such a construction is common in the art and is often referred to in the art as a dome, or as an epoxy dome when fabricated from epoxy. In a conventional LED chip, the height of the dome can be in the range of 2 mm to 10 mm. As seen in FIG. 4, the encapsulating material 116 can also be fabricated to have a flat top surface. A flat surface is more common than a dome when it is desired to reduce the angular divergence of the emitted light or radiation. In embodiments incorporating a collimating lens, a flat encapsulant surface is preferred. Infrared radiation emitted from the phosphor material 104 will pass through coating material 114 and/or encapsulating material 116 before passing through a transmission medium such as air. The encapsulating material 116 preferably comprises a material having a refractive index between the refractive index of the phosphor material 104 and the refractive index of air, allowing it to increase the efficiency of light transmission between the phosphor material 104 and air. This type of structure, where the phosphor 104 coated LED 102 is molded with features such as an encapsulating material/dome 116, an optical filter 118 and/or a collimating lens 120, may also be referred to in the art as an "LED package."

Phosphor-based infrared light emitting diodes can be used for a variety of applications ranging from television remote controls to night vision devices such as short wave infrared (SWIR) cameras. For example, they can be used as a light source in photoelectric sensors, such as photoelectric switches, as well as transmitting elements for devices such as video game joysticks. As desired, devices can include only one IR-LED as a light source, or multiple IR-LEDs can be used as a light source. See, for example, U.S. Pat. No. 6,495, 860, which is incorporated herein by reference, which teaches a process for manufacturing light emitting diodes with a blank that is punched with a plurality of sections, each of which is designed to hold its own LED. This process can be used to produce an array of IR-light emitting diodes as may be desired for the particular application.

EXAMPLES

Three samples of IR-light emitting diodes in accordance with the present technology were produced by applying rare earth-containing phosphors onto red to near-IR LED chips (dies) using similar fabrication techniques as are commonly used to make white light LEDs from blue LED chips with yellow phosphors (such as Ce:YAG).

The phosphors were mixed in with a clear silicone adhesive and applied to the pump LED chip. The LED housing units consisted of metal cans (for improved heat removal) with the pump LED chip bonded into the reflecting well and the phosphor was applied to the chip in sparing amounts. The LED was then sealed using standard techniques using a metal can top complete with a lensing structure to limit the LED divergence.

Each of the IR-LED samples produced were tested for a representative light emission of the phosphor. The emission is representative of the phosphor because the amount of pump light was strongly attenuated due to the high absorption of the types of phosphors used.

In each example, the phosphor absorbed almost all of the LED chip output, maximizing the output of the LED in the IR.

Figure 5:
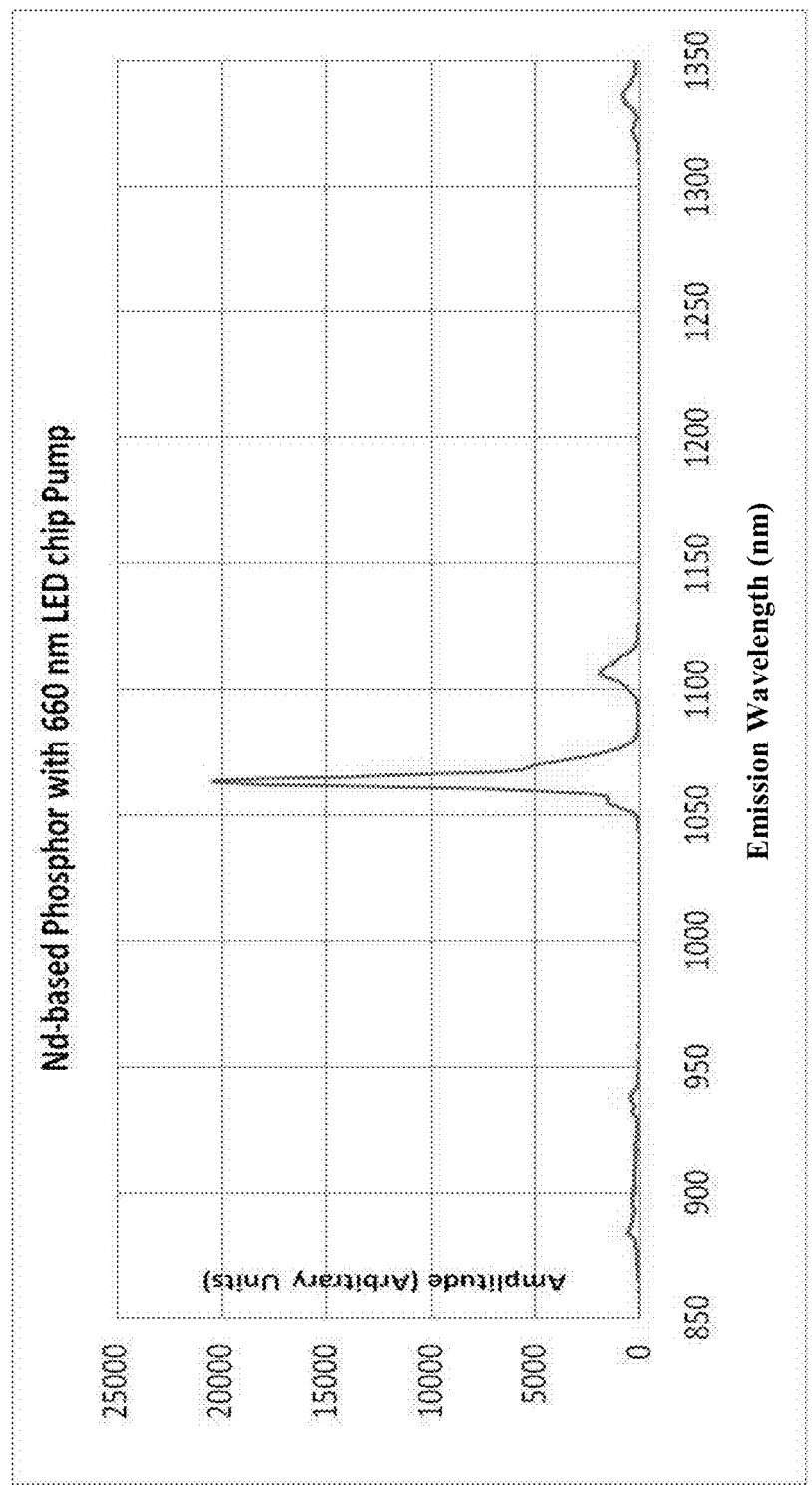
FIG. 5 is a graphical illustration of an emission spectrum of a neodymium (Nd)-based phosphor with a 660 nm LED chip pump.
Figure 6:
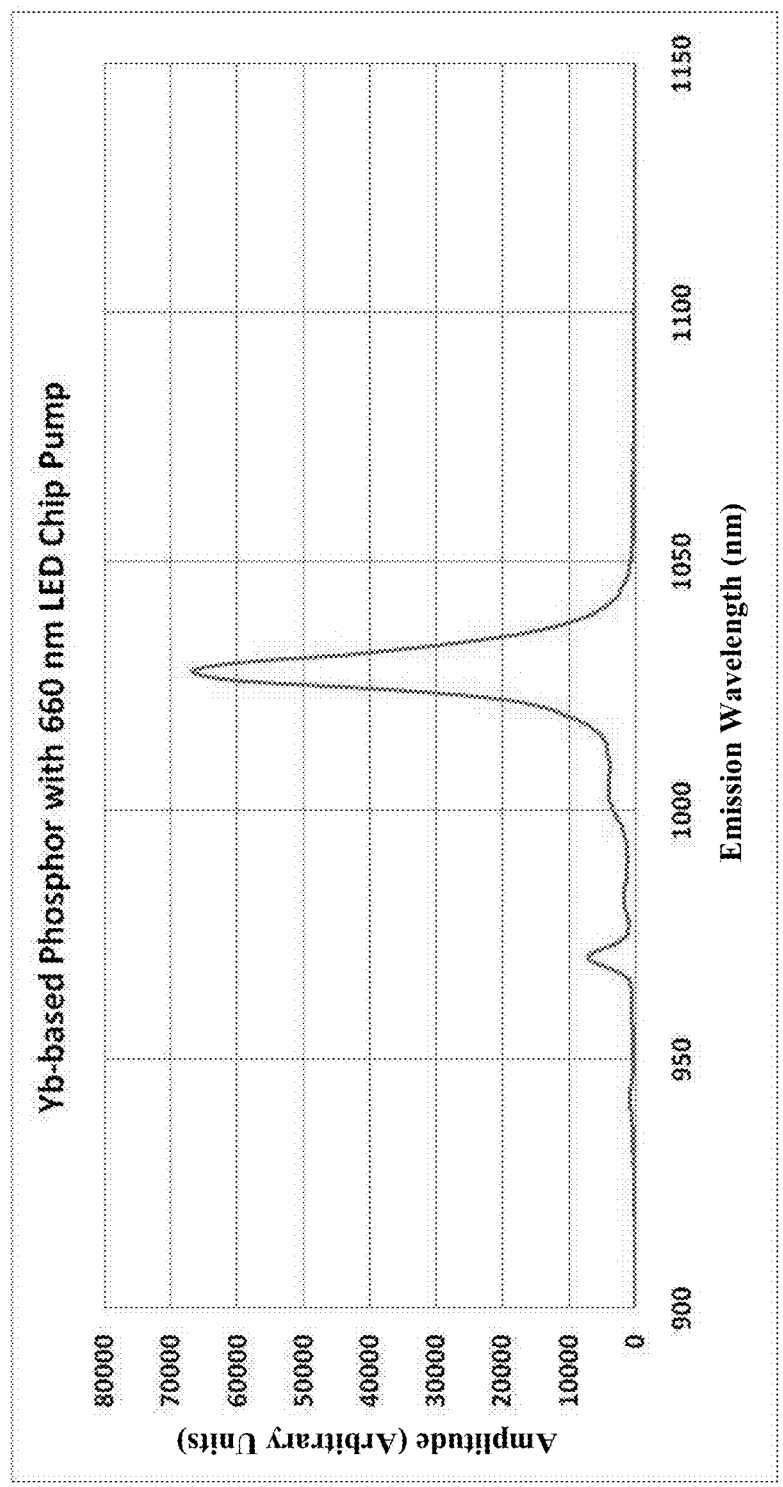
FIG. 6 is a graphical illustration of an emission spectrum of a ytterbium (Yb)-based phosphor with a 660 nm LED chip pump.
Figure 7:
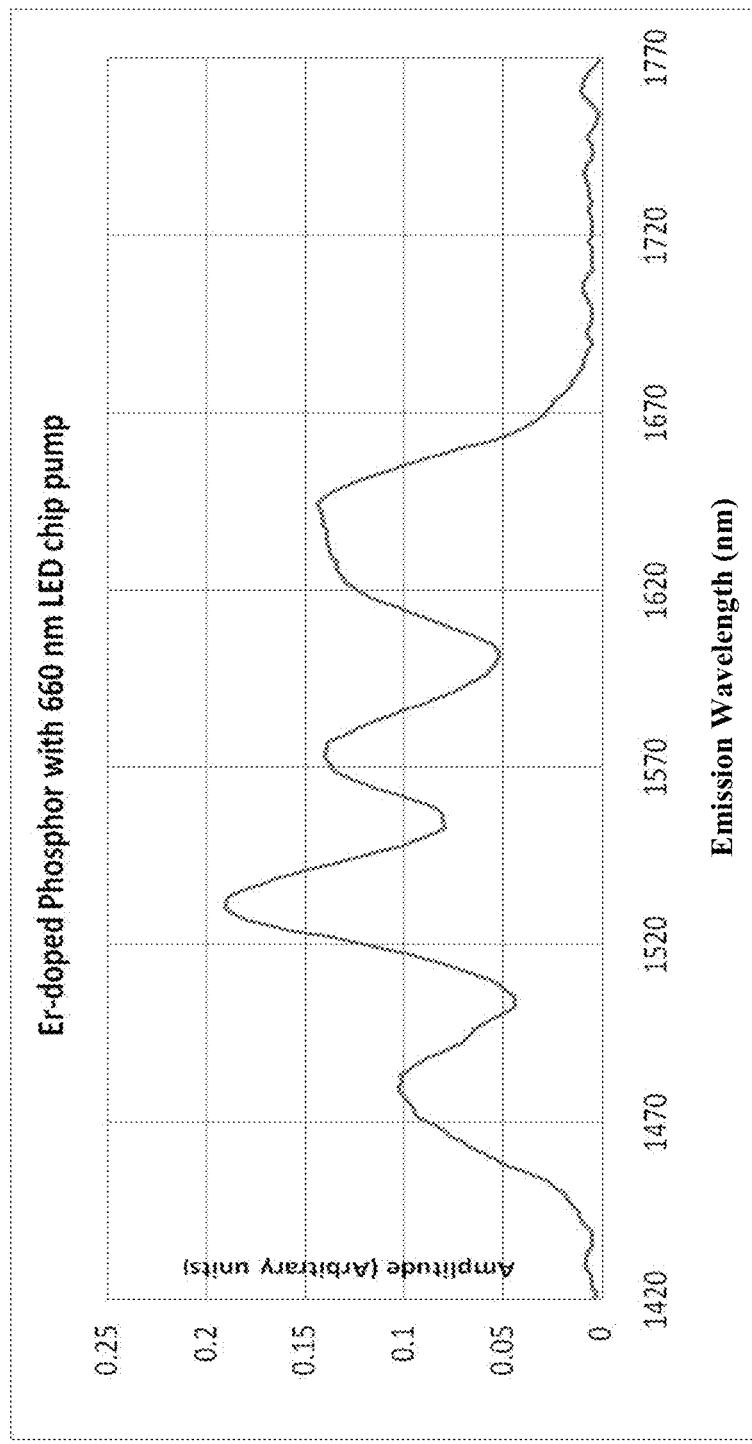
FIG. 7 is a graphical illustration of an emission spectrum of an erbium (Er)-based phosphor with a 660 nm LED chip pump.

Examples 1-3 list the types of phosphors tested and the results are graphically illustrated in FIGS. 5-7.

Example 1

A neodymium (Nd)-based phosphor with a 660 nm LED chip pump. The phosphor consists of a host lattice material of yttrium gallium garnet that includes a chromium sensitizer that absorbs the 660 nm LED chip pump emission and then transfers that energy, with high quantum efficiency, to the neodymium ions. The emission spectrum is graphically illustrated in FIG. 5.

Example 2

An ytterbium (Yb)-based phosphor with an 660 nm LED chip pump. The phosphor consists of a host lattice material of yttrium gallium garnet that includes a chromium sensitizer that absorbs the 660 nm LED chip pump emission and then transfers that energy, with high quantum efficiency, to the ytterbium ions. The emission spectrum is graphically illustrated in FIG. 6.

Example 3

An erbium (Er)-based phosphor with a 660 nm LED chip pump. The phosphor consists of a host lattice material of yttrium gallium garnet that includes a chromium sensitizer that absorbs the 660 nm LED chip pump emission and then transfers that energy, with high quantum efficiency, to the erbium ions. The emission spectrum is graphically illustrated in FIG. 7.

From the foregoing, it will be appreciated that although specific examples have been described herein for purposes of illustration, various modifications may be made without deviating from the spirit or scope of this disclosure. It is therefore intended that the foregoing detailed description be regarded as illustrative rather than limiting, and that it be understood that it is the following claims, including all equivalents, that are intended to particularly point out and distinctly claim the claimed subject matter.

What is claimed is:

1. A stokes radiation emitting device comprising:
   a) a light source; and
   b) an energy downconverting phosphor material on the light source, the phosphor material comprising at least one infrared radiation emitting phosphor that absorbs light energy emitted from said light source and emits infrared radiation responsive to said absorbed light energy, wherein said phosphor material comprises one or more rare earth element doped garnets, one or more rare earth element doped iron garnets, one or more mixed garnets doped with one or more rare earth elements, one or more rare earth element doped colquiriites, at least one garnet host phosphor doped with a rare earth emitting element, at least one garnet host phosphor doped with chromium and optionally one or more photon emitting rare earth elements, at least one garnet host phosphor doped with iron and optionally one or more photon emitting rare earth elements, yttrium gallium garnet, yttrium aluminum garnet, or a combination thereof.

2. The stokes radiation emitting device of claim 1, wherein said light source emits light energy having wavelengths of from the ultra-violet to the near infrared regions of the electromagnetic spectrum.

3. The stokes radiation emitting device of claim 1, wherein said light source comprises one or more ultraviolet to near infrared light emitting light emitting diodes.

4. The stokes radiation emitting device of claim 1, wherein said light source comprises one or more light emitting diodes that each comprise a semiconductor formed from gallium arsenide, aluminum gallium arsenide, gallium nitride, indium gallium nitride, aluminum gallium nitride, aluminum gallium phosphide, gallium arsenide phosphide, gallium phosphide, aluminum gallium indium nitride, or combinations thereof.

5. The stokes radiation emitting device of claim 1, wherein said phosphor material comprises a sensitizer, a dopant or both a sensitizer and a dopant, wherein the sensitizer comprises a substance capable of absorbing said light energy from the light source and capable of non-radiatively transferring said light energy to a dopant, and a dopant comprises a substance that absorbs light energy from the light source, sensitizer or both the light source and the sensitizer and emits radiation responsive to said absorbed light energy.

6. A stokes radiation emitting light emitting diode assembly comprising:
   a) a mount lead comprising a recessed cup and a lead, wherein said recessed cup optionally comprises a reflective metal capable of reflecting ultraviolet to infrared radiation;
   b) a light emitting diode semiconductor chip mounted in the recessed cup of the mount lead, the light emitting diode semiconductor chip having an electrode that is electrically connected to the mount lead; wherein the light emitting diode semiconductor chip comprises a material that emits light having wavelengths ranging from the ultra-violet to the near infrared regions of the electromagnetic spectrum when excited by electrical energy; and c) a phosphor material on the light emitting diode semiconductor chip, said phosphor material comprising at least one infrared radiation emitting phosphor that absorbs light energy from said light emitting diode semiconductor chip and emits infrared radiation responsive to said absorbed light energy, wherein said phosphor material comprises one or more rare earth element doped garnets, one or more rare earth element doped iron garnets, one or more mixed garnets doped with one or more rare earth elements, one or more rare earth element doped colquiriites, at least one garnet host phosphor doped with a rare earth emitting element, at least one garnet host phosphor doped with chromium and optionally one or more photo emitting rare earth elements, at least one garnet host phosphor doped with iron and optionally one or more photon emitting rare earth elements, yttrium gallium garnet, yttrium aluminum garnet, or a combination thereof.

7. The stokes radiation emitting diode assembly of claim 6, further comprising an infrared radiation-transparent material filling the recessed cup and covering the light emitting diode semiconductor chip.

8. The stokes radiation emitting light emitting diode assembly of claim 6, wherein the phosphor material is present as a blend with an infrared radiation-transparent material, wherein the recessed cup is filled with said blend and wherein the blend substantially completely covers the light emitting diode semiconductor chip.

9. The stokes radiation emitting light emitting diode assembly of claim 6, further comprising an optical filter positioned adjacent to both the light emitting diode semiconductor chip and the phosphor material, which optical filter is transparent to infrared radiation and is capable of blocking the transmission of light emitted from the light emitting diode semiconductor chip.

10. A stokes radiation emitting light emitting diode assembly comprising:

a) a mount lead comprising a recessed cup and a lead, wherein said recessed cup optionally comprises a reflective metal capable of reflecting ultraviolet to infrared radiation;

b) a light emitting diode semiconductor chip mounted in the recessed cup of the mount lead, the light emitting diode semiconductor chip having an electrode that is electrically connected to the mount lead; wherein the light emitting diode semiconductor chip comprises a material that emits light having wavelengths ranging from the ultra-violet to the near infrared regions of the electromagnetic spectrum when excited by electrical energy;

c) a phosphor material on the light emitting diode semiconductor chip, said phosphor material comprising at least one infrared radiation emitting phosphor that absorbs light energy from said light emitting diode semiconductor chip and emits infrared radiation responsive to said absorbed light energy; and a collimating lens positioned adjacent to the light emitting diode semiconductor chip that is capable of reducing the angular divergence of the infrared radiation emitted from said phosphor material.

11. The stokes radiation emitting light emitting diode assembly of claim 6, further comprising both an optical filter positioned adjacent to both the light emitting diode semiconductor chip and the phosphor material, which optical filter is transparent to infrared radiation and is capable of blocking the transmission of light emitted from the light emitting diode semiconductor chip, and a collimating lens positioned adjacent to the light emitting diode semiconductor chip that is capable of reducing the angular divergence of the infrared radiation emitted from said phosphor material.

12. The stokes radiation emitting light emitting diode assembly of claim 6, wherein said light emitting diode semiconductor chip comprises a semiconductor formed from gallium arsenide, aluminum gallium arsenide, gallium nitride, indium gallium nitride, aluminum gallium nitride, aluminum gallium phosphide, gallium arsenide phosphide, gallium phosphide, aluminum gallium indium nitride, or two or more thereof.

13. The stokes radiation emitting light emitting diode assembly of claim 6, wherein said phosphor material comprises a sensitizer, a dopant or both a sensitizer and a dopant, wherein the sensitizer comprises a substance capable of absorbing said light energy from the light source and capable of non-radiatively transferring said light energy to a dopant, and a dopant comprises a substance that absorbs light energy from the light source, sensitizer or both the light source and the sensitizer and emits radiation responsive to said absorbed light energy.

* * * * *